United States Patent
Kim et al.

(10) Patent No.: US 8,952,299 B2
(45) Date of Patent: Feb. 10, 2015

(54) DUAL RESISTANCE HEATER FOR PHASE CHANGE DEVICES AND MANUFACTURING METHOD THEREOF

(71) Applicant: Micron Technology, Inc., Boise, ID (US)

(72) Inventors: Yudong Kim, Santa Clara, CA (US);
Ilya V Karpov, Santa Clara, CA (US);
Charles C. Kuo, Union City, CA (US);
Greg Atwood, Los Gatos, CA (US);
Maria Santina Marangon, Merate (IT);
Tyler A. Lowrey, West Augusta, VA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/970,207

(22) Filed: Aug. 19, 2013

(65) Prior Publication Data

US 2014/0038379 A1    Feb. 6, 2014

Related U.S. Application Data

(60) Continuation of application No. 12/980,141, filed on Dec. 28, 2010, now Pat. No. 8,513,576, which is a division of application No. 11/312,231, filed on Dec. 19, 2005, now Pat. No. 7,880,123.

(30) Foreign Application Priority Data

Dec. 30, 2004  (EP) .................................. 04107070

(51) Int. Cl.
*H05B 1/02* (2006.01)
*H05B 3/02* (2006.01)
(Continued)

(52) U.S. Cl.
CPC ............ *H01L 45/16* (2013.01); *H01L 27/2427* (2013.01); *H01L 45/06* (2013.01);
(Continued)

(58) Field of Classification Search
CPC ....................................................... H01L 45/06
USPC .................... 219/497, 121.48–121.49, 121.5, 219/121.51–121.53, 121.59, 163; 338/7, 338/13; 365/148, 163; 257/52
See application file for complete search history.

(56) References Cited

U.S. PATENT DOCUMENTS 3,271,591 A    9/1966    Ovshinsky
3,922,648 A   11/1975   Buckley
(Continued)

FOREIGN PATENT DOCUMENTS

EP    1331675 A1    7/2003
KR    2002054844    7/2002
(Continued)

*Primary Examiner* — Dana Ross
*Assistant Examiner* — Gyounghyun Bae
(74) *Attorney, Agent, or Firm* — Schwegman Lundberg & Woessner, P.A.

(57) ABSTRACT

A dual resistance heater for a phase change material region is formed by depositing a resistive material. The heater material is then exposed to an implantation or plasma which increases the resistance of the surface of the heater material relative to the remainder of the heater material. As a result, the portion of the heater material approximate to the phase change material region is a highly effective heater because of its high resistance, but the bulk of the heater material is not as resistive and, thus, does not increase the voltage drop and the current usage of the device.

22 Claims, 9 Drawing Sheets

(51) Int. Cl.
*B23K 9/00* (2006.01)
*B23K 9/02* (2006.01)
*H01L 45/00* (2006.01)
*H01L 27/24* (2006.01)

(52) U.S. Cl.
CPC ......... *H01L45/1233* (2013.01); *H01L 45/126* (2013.01); *H01L 45/141* (2013.01); *H01L 45/1683* (2013.01)
USPC ........... 219/497; 219/489; 219/490; 219/491; 219/492; 219/493; 219/494; 219/495; 219/496; 219/498; 219/499; 219/500; 219/501; 219/502; 219/503; 219/504; 219/505; 219/506; 219/121.48; 219/121.49; 219/121.5; 219/121.51; 219/121.52; 219/121.53; 219/121.59

(56) References Cited

U.S. PATENT DOCUMENTS

| | | | |
|---|---|---|---|
| 4,003,075 A | 1/1977 | Merrin | |
| 4,177,475 A | 12/1979 | Holmberg | |
| 4,225,946 A | 9/1980 | Neale et al. | |
| 4,499,557 A | 2/1985 | Holmberg et al. | |
| 4,500,388 A | 2/1985 | Ohmura et al. | |
| 4,782,340 A * | 11/1988 | Czubatyj et al. | 345/92 |
| 5,210,766 A * | 5/1993 | Winer et al. | 372/40 |
| 5,330,630 A * | 7/1994 | Klersy et al. | 204/192.25 |
| 5,363,329 A * | 11/1994 | Troyan | 365/184 |
| 5,596,522 A * | 1/1997 | Ovshinsky et al. | 365/113 |
| 5,726,484 A * | 3/1998 | Hart et al. | 257/530 |
| 5,825,046 A | 10/1998 | Czubatyj et al. | |
| 5,866,930 A | 2/1999 | Saida et al. | |
| 6,147,395 A * | 11/2000 | Gilgen | 257/529 |
| 6,229,157 B1 * | 5/2001 | Sandhu | 257/75 |
| 6,462,353 B1 * | 10/2002 | Gilgen | 257/3 |
| 6,492,656 B2 * | 12/2002 | Zahorik et al. | 257/3 |
| 6,507,061 B1 * | 1/2003 | Hudgens et al. | 257/295 |
| 6,555,860 B2 * | 4/2003 | Lowrey et al. | 257/296 |
| 6,774,388 B2 * | 8/2004 | Hudgens et al. | 257/3 |
| 6,930,913 B2 * | 8/2005 | Pellizzer et al. | 365/163 |
| 7,253,108 B2 | 8/2007 | Zonca | |
| 7,489,552 B2 | 2/2009 | Kurotsuchi et al. | |
| 7,642,622 B2 | 1/2010 | Yi et al. | |
| 7,682,866 B2 * | 3/2010 | Hart et al. | 438/95 |
| 7,684,235 B2 * | 3/2010 | Liu | 365/163 |
| 7,838,341 B2 * | 11/2010 | Dennison | 438/128 |
| 7,880,123 B2 | 2/2011 | Kim | |
| 8,513,576 B2 | 8/2013 | Kim et al. | |
| 8,530,875 B1 * | 9/2013 | Chang et al. | 257/4 |
| 8,785,900 B2 * | 7/2014 | Wells | 257/4 |
| 2002/0038872 A1 * | 4/2002 | Lowrey et al. | 257/178 |
| 2003/0001211 A1 * | 1/2003 | Hudgens et al. | 257/355 |
| 2003/0164515 A1 * | 9/2003 | Xu | 257/296 |
| 2003/0234449 A1 * | 12/2003 | Aratani et al. | 257/758 |
| 2004/0067608 A1 | 4/2004 | Dennison | |
| 2004/0084727 A1 * | 5/2004 | Ueda et al. | 257/347 |
| 2004/0113135 A1 * | 6/2004 | Wicker | 257/2 |
| 2004/0113232 A1 * | 6/2004 | Johnson et al. | 257/529 |
| 2004/0114413 A1 | 6/2004 | Parkinson et al. | |
| 2004/0188668 A1 | 9/2004 | Hamann et al. | |
| 2004/0214415 A1 * | 10/2004 | Pellizzer et al. | 438/583 |
| 2004/0233748 A1 * | 11/2004 | Terao et al. | 365/202 |
| 2005/0029504 A1 | 2/2005 | Karpov | |
| 2006/0246712 A1 | 11/2006 | Kim et al. | |
| 2008/0210923 A1 | 9/2008 | Sato | |
| 2008/0291718 A1 * | 11/2008 | Liu | 365/163 |
| 2008/0316798 A1 * | 12/2008 | Tanizaki et al. | 365/148 |
| 2010/0046274 A1 * | 2/2010 | Tsuchida et al. | 365/148 |
| 2010/0238711 A1 * | 9/2010 | Asao | 365/148 |
| 2011/0155986 A1 | 6/2011 | Kim et al. | |

FOREIGN PATENT DOCUMENTS

| | | |
|---|---|---|
| KR | 2003058044 | 7/2003 |
| WO | WO-0209206 A1 | 1/2002 |

* cited by examiner

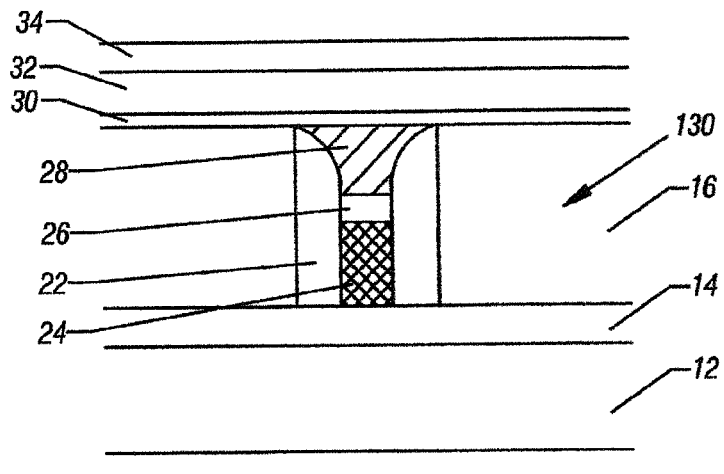
FIG. 11  *10*
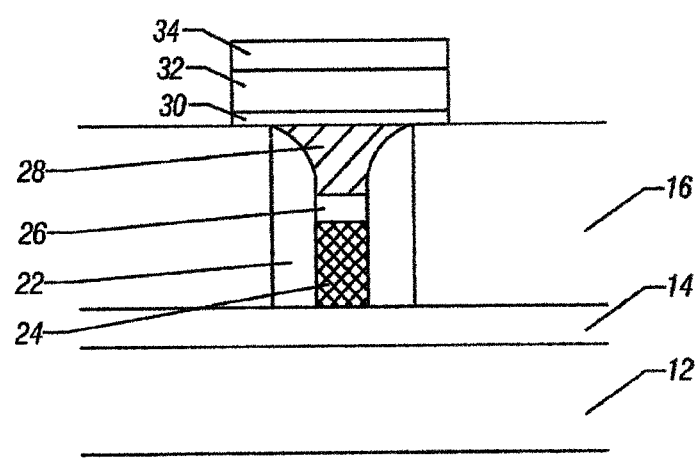
FIG. 12  *10*
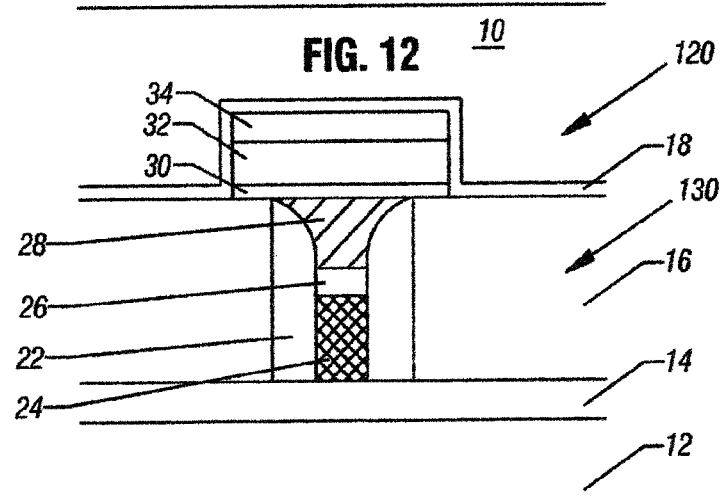
FIG. 13  *10*

DUAL RESISTANCE HEATER FOR PHASE CHANGE DEVICES AND MANUFACTURING METHOD THEREOF

CROSS-REFERENCE TO RELATED APPLICATIONS

This application is a continuation of U.S. application Ser. No. 12/980,141, filed Dec. 28, 2010, which is a divisional of U.S. patent application Ser. No. 11/312,231, filed Dec. 19, 2005, which claims the benefit of EP 04107070.7, filed Dec. 30, 2004, all of which are incorporated herein by reference in their entirety.

BACKGROUND OF THE INVENTION

1. Field of the Invention

This invention relates to a dual resistance heater for phase change devices and to the manufacturing method thereof. In particular, the invention relates to a heater for phase change memory devices.

2. Description of the Related Art

Phase change memory devices use phase change materials, i.e., materials that may be electrically switched between a generally amorphous and a generally crystalline state, for electronic memory application. One type of memory element utilizes a phase change material that is electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

Turning to FIG. 1, an embodiment of a memory 100 is illustrated. Memory 100 includes a nXn array of memory cells 111-119, wherein memory cells 111-119 each include a select device 120 and a memory element 130.

Memory elements 130 comprise a phase change material, thus memory 100 may be referred to as a phase change memory. A phase change material is a material having electrical properties (e.g., resistance, capacitance, etc.}that may be changed through the application of energy such as, for example, heat, light, voltage potential, or electrical current. Examples of a phase change material include a chalcogenide material.

A chalcogenide alloy may be used in a memory element or in an electronic switch. A chalcogenide material is a material that includes at least one element from column VI of the periodic table or is a material that includes one or more of the chalcogenic elements, e.g., any of the elements of tellurium, sulfur, or selenium.

Memory 100 includes column lines 141-143 and row lines 151-153 to select a particular memory cell of the array during a write or read operation. Column lines 141-143 and row lines 151-153 may also be referred to as address lines since these lines may be used to address memory cells 111-119 during programming or reading. Column lines 141-143 may also be referred to as bit lines and row lines 151-153 may also be referred to as word lines.

Memory elements 130 are connected to row lines 151-153 and are coupled to column lines 141-143 via select device 120. While one select device 120 is depicted, more select devices may also be used. Therefore, when a particular memory cell (e.g., memory cell 115) is selected, voltage potentials may be applied to the memory cell's associated column line (e.g., 142) and row line (e.g., 152) to apply a voltage potential across the memory cell.

Series connected select device 120 is used to access memory element 130 during programming or reading of memory element 130. The select device 120 is an ovonic threshold switch that is made of a chalcogenide alloy that does not exhibit an amorphous to crystalline phase change and which undergoes rapid, electric field initiated change in electrical conductivity that persists only so long as a holding voltage is present. Select device 120 operates as a switch that is either "off" or "on" depending on the amount of voltage potential applied across the memory cell, and more particularly whether the current through the select device exceeds its threshold current or voltage, which then triggers the device into the on state. The off state is a substantially electrically nonconductive state and the on state is a substantially conductive state, with less resistance than the off state. In the on state, the voltage across the select device is equal to its holding voltage VH plus IxRon, where Ron is the dynamic resistance from VH. For example, select device 120 has a threshold voltage and, if a voltage potential less than the threshold voltage of a select device 120 is applied across select device 120, then the select device 120 remains "off" or in a relatively high resistive state so that little or no electrical current passes through the memory cell and most of the voltage drop from selected row to selected column is across the select device. Alternatively, if a voltage potential greater than the threshold voltage of select device 120 is applied across select device 120, then the select device 120 "turns on," i.e., operates in a relatively low resistive state so that electrical current passes through the memory cell. In other words, select device 120 is in a substantially electrically nonconductive state if less than a predetermined voltage potential, e.g., the threshold voltage, is applied across select device 120. Select device 120 is in a substantially conductive state if greater than the predetermined voltage potential is applied across select device 120. Select device 120 may also be referred to as an access device, an isolation device, or a switch.

Here, each select device 120 comprises a switching material such as, for example, a chalcogenide alloy, and may be referred to as an ovonic threshold switch, or simply an ovonic switch. The switching material of select device 120 is a material in a substantially amorphous state positioned between two electrodes that may be repeatedly and reversibly switched between a higher resistance "off" state (e.g., greater than about ten megaOhms) and a relatively lower resistance "on" state (e.g., about one thousand Ohms in series with VH) by application of a predetermined electrical current or voltage potential. Here, each select device 120 is a two terminal device that has a current-voltage (I-V) characteristic similar to a phase change memory element that is in the amorphous state. However, unlike a phase change memory element, the switching material of select device 120 does not change phase. That is, the switching material of select device 120 is not a programmable material, and, as a result, select device 120 is not a memory device capable of storing information. For example, the switching material of select device 120 remains permanently amorphous and the I-V characteristic remains the same throughout the operating life. A representative example of I-V characteristics of select device 120 is shown in FIG. 2.

In FIG. 2, in the low voltage or low electric field mode, i.e., where the voltage applied across select device 120 is less than a threshold voltage (labeled VTH), select device 120 is "off"

or nonconducting, and exhibits a relatively high resistance, e.g., greater than about 10 megaOhms. Select device 120 remains in the off state until a sufficient voltage, e.g., VTH, is applied, or a sufficient current is applied, e.g., ITH, that switches select device 120 to a conductive, relatively low resistance on state. After a voltage potential greater than about VTH is applied across select device 120, the voltage potential across select device 120 drops ("snapback") to a holding voltage potential, labeled VH. Snapback refers to the voltage difference between VTH and VH of a select device.

In the on state, the voltage potential across select device 120 remains close to the holding voltage VH as current passing through select device 120 is increased. Select device 120 remains on until the current through select device 120 drops below a holding current, labeled IH. Below this value, select device 120 turns off and returns to a relatively high resistance, nonconductive off state until the VTH and ITH are exceeded again.

In known phase change memory cells, there is the problem that relatively high levels of currents are required to switch the phase change material of the memory elements.

Another disadvantage of known change memory cells resides in the poor adhesion of the chalcogenide material to the underlying heater, resulting in some instances in a delamination of patterned electrode stacks.

The same problem affects all devices including a phase change material layer overlying a resistive heater.

BRIEF SUMMARY OF THE INVENTION

In one embodiment, the present invention provides a device including a phase change layer that requires less current for causing switching of the phase change layer. In particular, the device comprises a phase change material region and a heater, the heater having a surface region in contact with said phase change material region, wherein the surface region has a higher resistance than that of another portion of said heater.

In another embodiment, a method for manufacturing a phase change device is described, the method comprising forming a heater and increasing the resistance of a surface of the heater by ion implantation of silicon or oxygen ion.

BRIEF DESCRIPTION OF THE SEVERAL VIEWS OF THE DRAWING(S)

For the understanding of the present invention, preferred embodiments are now described, purely as a non-limitative example, with reference to the enclosed drawings, wherein:

FIGS. 4-13 are enlarged cross-sectional views of the embodiment shown in FIG. 3 at subsequent stages of manufacture in accordance with one embodiment of the present invention;

DETAILED DESCRIPTION OF THE INVENTION

Figure 1:
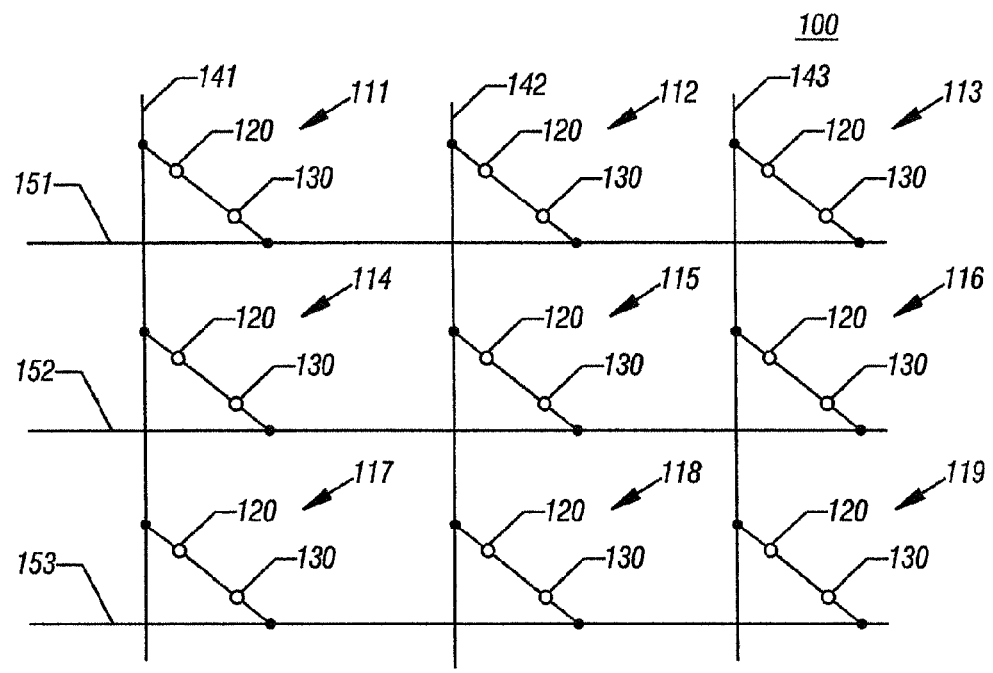
FIG. 1 is a schematic diagram illustrating a phase change memory.
Figure 2:
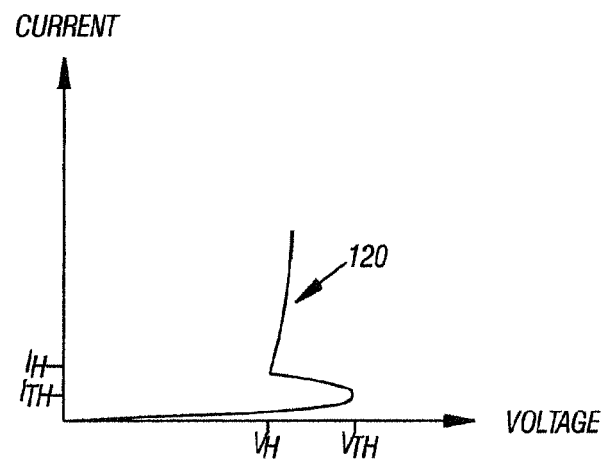
FIG. 2 is a diagram illustrating a current-voltage characteristic of an access device of the phase change memory of FIG. 1.
Figure 3:
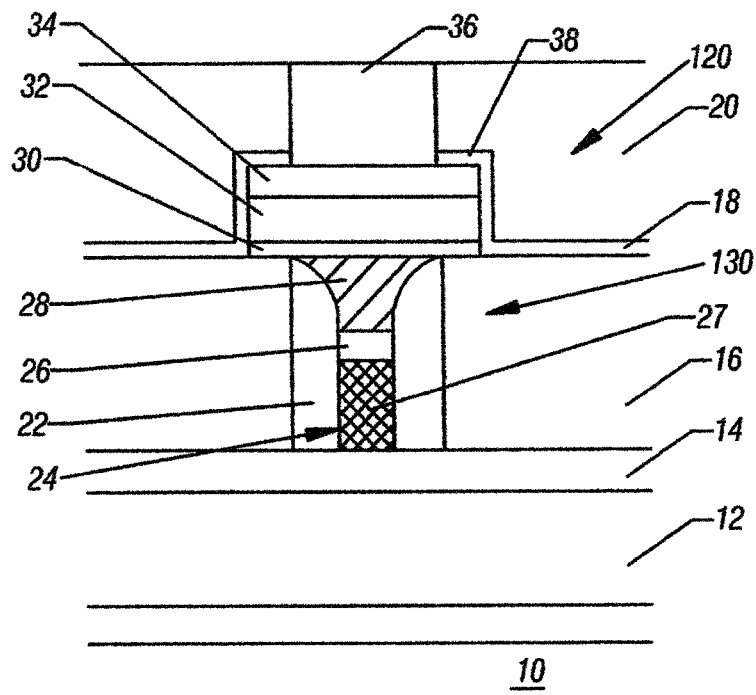
FIG. 3 is an enlarged cross-sectional view of one embodiment of the present invention.

Referring to FIG. 3, a phase change memory cell, such as a cell 111-119 in FIG. 1, is formed in a substrate 10. Over the substrate 10 various interconnections and transistor features are formed. An interlayer dielectric 12 separates those features from the features provided above the interlayer dielectric 12. A conductor 14 extends above the interlayer dielectric 12 and act as a row line 151-153 (FIG. 1). At the top, a conductor 36 extends generally transversely to the electrode 14 and acts as a column line 141-143 (FIG. 1).

A dielectric layer 16 has a pore formed therein and the pore accommodates a spacer 22, a lance heater 24, and a phase change memory material 28 which, together with the heater 24, form a phase change memory element 130 (FIG. 1). A region 26 of the heater 24 has a higher resistance than the region 27. Thus, the heater 24 is a dual resistance heater made up of the region 26 and the region 27, each region having a different resistance, although both regions may be formed of the same starting material. The region 27 has a lower resistance, so it creates a lower voltage drop, reducing the power consumed by the heater 24 and, thus, the cell as a whole.

An ovonic threshold device 120 (FIG. 1) is formed above the phase change memory material 28 and acts as a selection or threshold device for the underlying memory element 130. The ovonic threshold device 120 is formed in a dielectric layer 18, e.g., of nitride, and in a dielectric layer 20, e.g., oxide. The threshold device 120 includes a lower electrode 30, an upper electrode 34, a surrounding dielectric layer 38, and a switching material 32. The switching material 32 may, like the memory material 28, be a chalcogenide. However, generally, the switching material 32 does not change phase.

Figure 4:
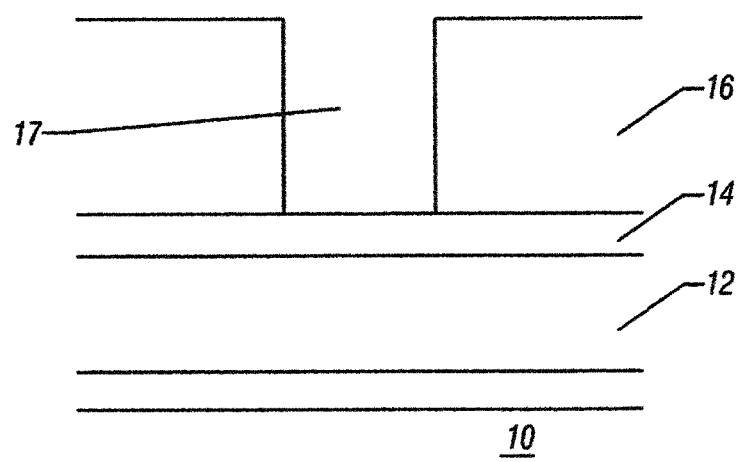

The formation of the cell shown in FIG. 3 begins with the formation of a contact or lance opening 17 in the dielectric 16, as shown in FIG. 4. The dielectric 16 is, e.g., of oxide.

Figure 5:
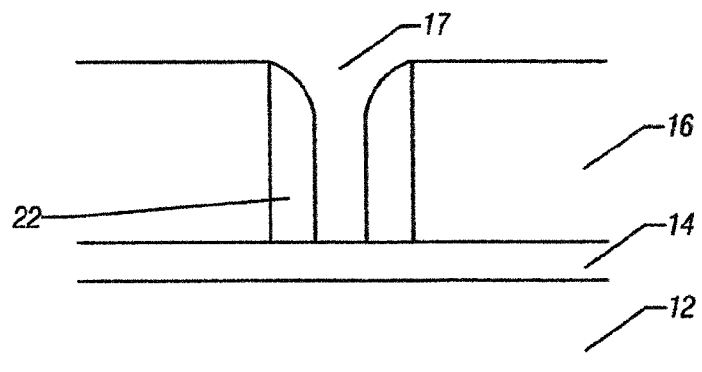

Next, as shown in FIG. 5, a sidewall spacer 22 is formed in the opening 17. The sidewall spacer 22 may be formed by conventional techniques, including the deposition of a layer of nitride followed by anisotropic etching.

Figure 6:
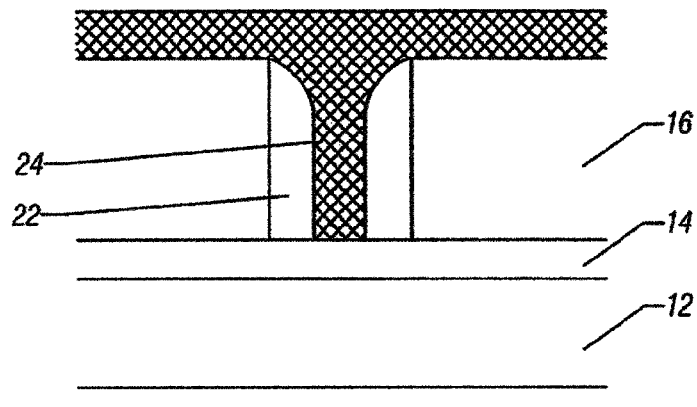

Then, FIG. 6, a heater 24 is deposited to fill the opening 17. The heater 24 may, for example, be titanium nitride.

Figure 7:
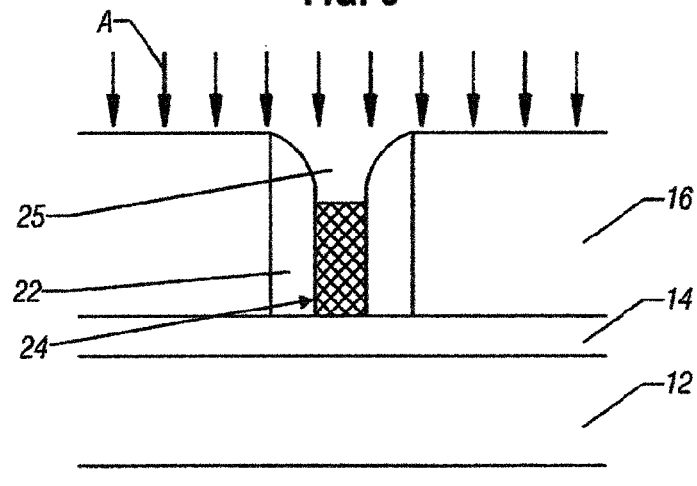

The heater 24 is recessed to create the recess 25 shown in FIG. 7. The heater 24 is planarized prior to being recessed. The recess 25 may be created by dry or wet etching processes known as dip backs or etch backs. Thereafter, the exposed structure is subjected to an ion implantation indicated as A in FIG. 7. E.g., the ion implantation may be an implantation of silicon at 20 keV and 1015 atoms per square centimeter.

A result of the implant is to convert at least an upper region 26 of the heater 24 into a higher resistance state. For example, where the heater 24 is titanium nitride, the upper region 26, shown in FIG. 8, becomes titanium silicon nitride as a result of an implant followed by an effective anneal while the remaining region 27 remains titanium nitride. The titanium silicon nitride in the region 26 has a higher resistance than the underlying material in the region 27.

Figure 8:
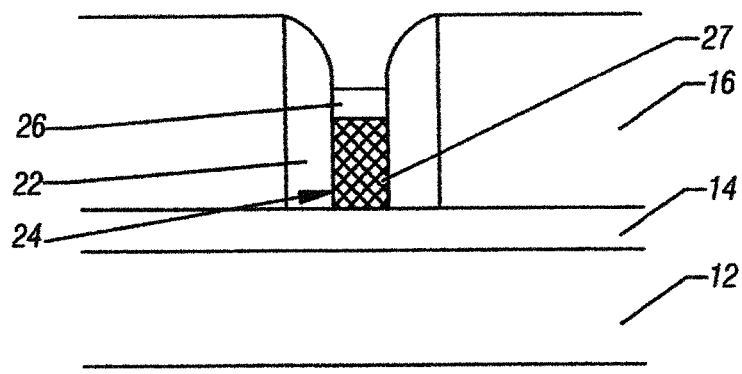

Thus, FIG. 8, the upper region 26 of the heater 24 has a higher resistance than the region 27. Preferably, the upper region 26 is a very small portion of the overall heater 24. In other words, the heater 24 is much bigger in thickness and volume than the region 26, the region 26 only constituting a few surface layers.

As another alternative, the resistance of the region 26 may be increased by an oxygen plasma treatment. In such case, the arrows A represent oxygen plasma which reacts with the heater 24 to form an oxide thereof. That oxide, in the region 26, has higher resistance than the underlying region 27 of the heater 24.

In the case of an implant to increase the resistance of the region 26, a separate anneal step may not be necessary. For example, ensuing steps that involve temperature processing of 250° C. may be sufficient to activate the implanted species.

Figure 9:
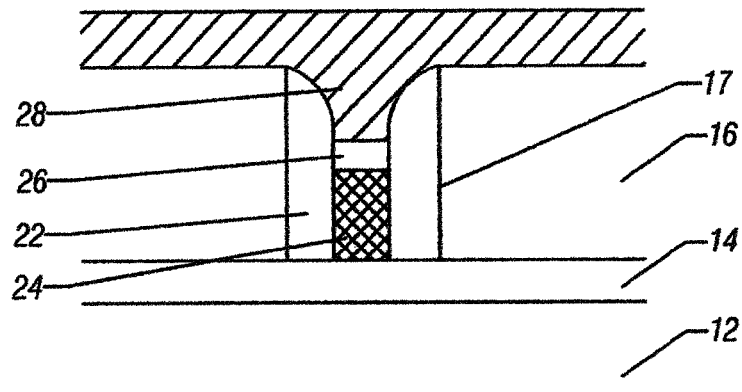
Figure 10:
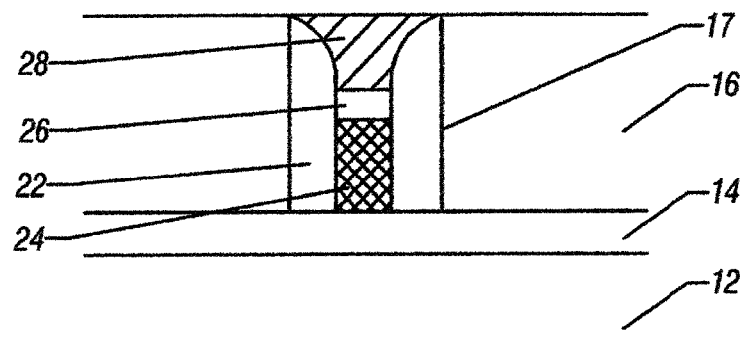

As shown in FIG. 9, a chalcogenide material 28 is then deposited into the pore 17 with the heater 24. The memory material 28 acts as the phase change memory material for the cell. The implantation of FIG. 7 also improves adhesion of dielectric layers, such as spacer 22 and layer 16, to the material 28. The memory material 28 is then planarized as shown in FIG. 10.

In FIG. 11, the ovonic threshold switch 120 (FIG. 1) is then formed over the memory element 130. An electrode 30 is deposited, followed by the deposition of a chalcogenide material 32 that does not change phase, in turn followed by an upper electrode 34. The sandwich of the upper electrode 34, chalcogenide material 32, and lower electrode 30 is then patterned as indicated in FIG. 12.

The patterned structure is covered with a passivation layer 18 as shown in FIG. 13. The passivation layer 18 may, for example, be a nitride. Thus, the passivation layer 18 covers the underlying portion of the dielectric 16 and the threshold device 120.

Thereafter, a dielectric 20 is deposited as shown in FIG. 3. The dielectric 20 is trenched and an upper electrode 36 is formed in the trench. The upper electrode may act as a column line 141-143 (FIG. 1).

Memory material 28 is a phase change, programmable material capable of being programmed into one of at least two memory states by applying a current to memory material 28 to alter the phase of memory material 28 between a substantially crystalline state and a substantially amorphous state, wherein a resistance of memory material 28 in the substantially amorphous state is greater than the resistance of memory material 28 in the substantially crystalline state.

Programming of memory material 28 to alter the state or phase of the material is accomplished by applying voltage potentials to the conductors 14 and 36, thereby generating a voltage potential across select device 120 and memory element 130. When the voltage potential is greater than the threshold voltage of select device 120 and memory element 130, then an electrical current flows through memory material 28 in response to the applied voltage potential, and results in heating of memory material 28.

This heating alters the memory state or phase of memory material 28. Altering the phase or state of memory material 28 alters the electrical characteristic of memory material 28, e.g., the resistance of the material is altered by altering the phase of the memory material 28. Memory material 28 is referred to as a programmable resistive material.

In the "reset" state, memory material 28 is in an amorphous or semi-amorphous state and in the "set" state, memory material 28 is in a crystalline or semi-crystalline state. The resistance of memory material 28 in the amorphous or semi-amorphous state is greater than the resistance of memory material 28 in the crystalline or semi-crystalline state. It is to be appreciated that the association of reset and set with amorphous and crystalline states, respectively, is a convention and that at least an opposite convention may be adopted.

Using electrical current, memory material 28 is heated to a relatively higher temperature to amorphosize memory material 28 and "reset" memory material 28 (e.g., program memory material 28 to a logic "0" value). Heating the volume of memory material 28 to a relatively lower crystallization temperature crystallizes memory material 28 and "sets" memory material 28 (e.g., program memory material 28 to a logic "1" value). Various resistances of memory material 28 may be achieved to store information by varying the amount of current flow and duration through the volume of memory material 28.

The composition of switching material 32 may comprise a Si concentration of about 14%, a Te concentration of about 39%, an As concentration of about 37%, a Ge concentration of about 9%, and an In concentration of about 1%. In another example, the composition of switching material 32 may comprise a Si concentration of about 14%, a Te concentration of about 39%, an As concentration of about 37%, a Ge concentration of about 9%, and a P concentration of about 1%.

In these examples, the percentages are atomic percentages which total 100% of the atoms of the constituent elements.

In another embodiment, a composition for switching material 32 includes an alloy of arsenic (As), tellurium (Te), sulfur (S), germanium (Ge), selenium (Se), and antimony (Sb) with respective atomic percentages of 10%, 21%, 2%, 15%, 50%, and 2%.

In other embodiments, switching material 32 includes Si, Te, As, Ge, sulfur (S), and selenium (Se). As an example, the composition of switching material 32 comprises a Si concentration of about 5%, a Te concentration of about 34%, an As concentration of about 28%, a Ge concentration of about 11%, a S concentration of about 21%, and a Se concentration of about 1%.

The switching material 32 is a thin film material having a thickness ranging from about 20 A to about 2000 A. In one embodiment, the thickness of the material 32 ranges from about 100 A to about 1000 A. In another embodiment, the thickness of the material 32 is about 300 A.

Suitable materials for electrodes 30 and 34 include a thin film of titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with switching material 32.

Figure 14:
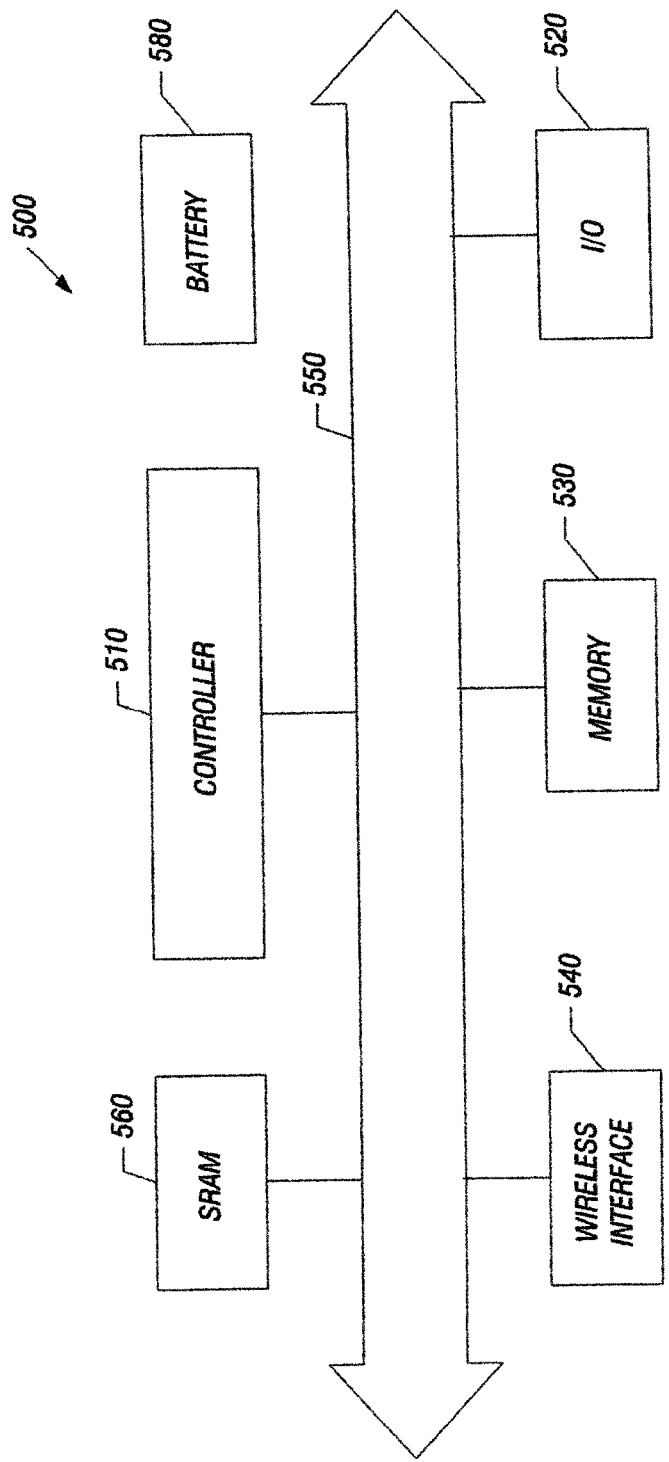
FIG. 14 is a schematic system depiction of one embodiment of the present invention.

Turning to FIG. 14, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 includes a controller 510, an input/output (I/O) device 520 (e.g., a keypad, display), a memory 530, and a wireless interface 540 coupled to each other via a bus 550.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory 100 discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver.

In accordance with another embodiment of the present invention, the dielectric region surrounding the heater is treated to improve the adhesion properties thereof.

Figure 15:
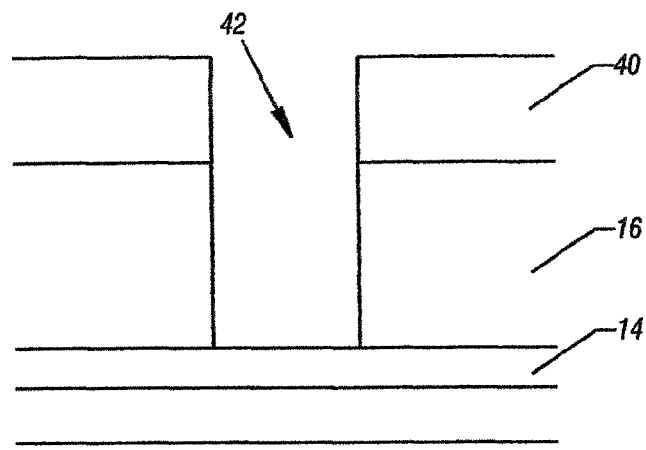
FIGS. 15-21 are enlarged cross-sectional views of another embodiment of the present invention at subsequent stages of manufacture.

According to this embodiment, as shown in FIG. 15, a second dielectric layer 40 is formed over the dielectric layer 16 and the stack of the dielectric layer 16 and the second dielectric layer 40 is etched to form an opening 42 defining a contact opening structure. The remaining structure of FIG. 15 is similar to the structure previously described in connection with FIG. 4.

Figure 16:
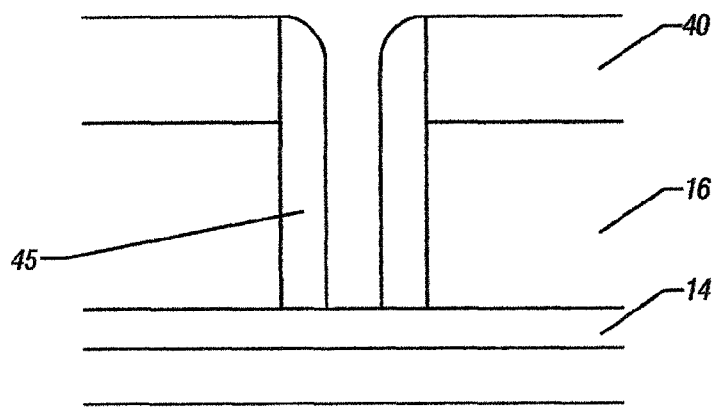

Next, FIG. 16, the opening 42 is covered with a sidewall spacer 45, using known techniques. The spacer 45 is e.g., of nitride.

Figure 17:
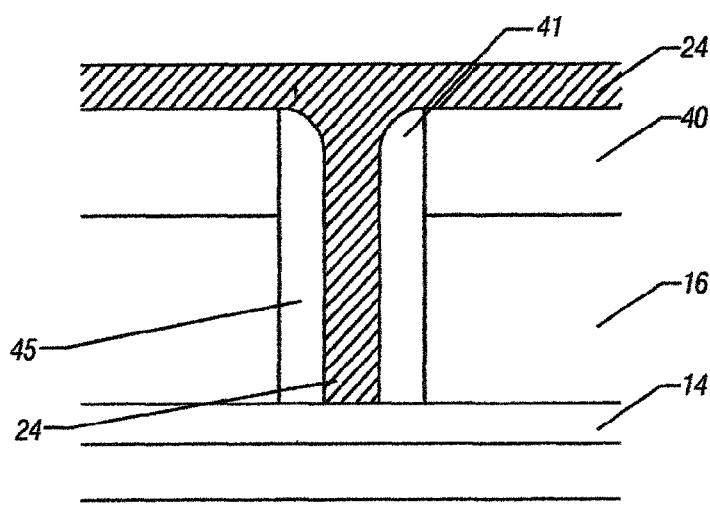
Figure 18:
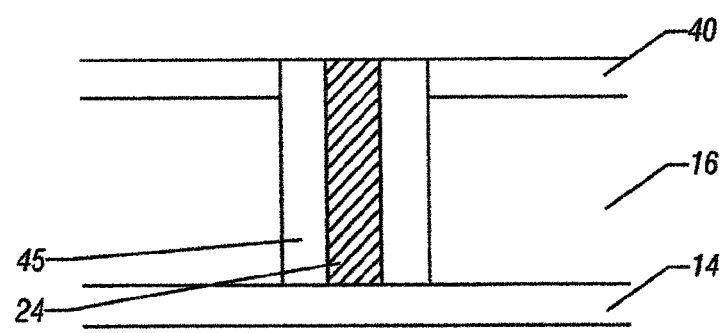

Then, as shown in FIG. 17, the heater 24 is deposited to completely fill the remaining opening 42 and to cover the top of the second dielectric layer 40. This structure is then planarized in a timed polish so as to remove a portion of the second dielectric layer 40, and to polish away the flared region 41 of the spacer 45, as shown in FIG. 18.

Figure 19:
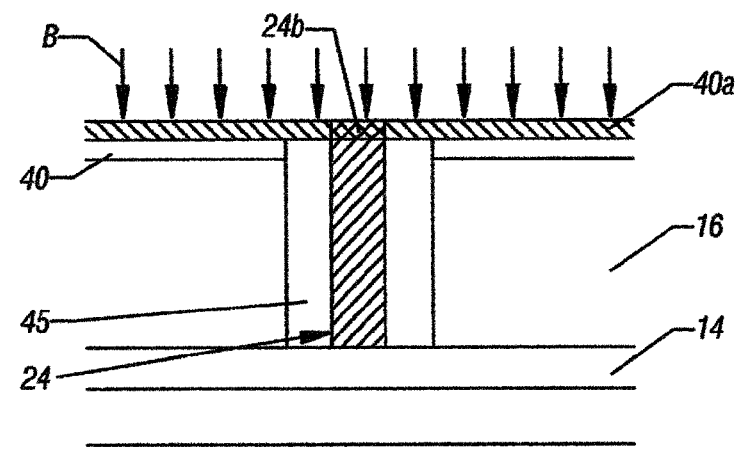

Thereafter, a silicon implant is accomplished as indicated at B in FIG. 19. The implant converts the top portion 40*a* of the second dielectric layer 40 to silicon nitride. The implant conditions are the same as those described previously in connection with FIG. 7.

Silicon-implanted nitride has good adhesion to overlying layers including chalcogenide containing layers. Thus, the silicon-implanted nitride layer 40*a* acts as a glue or adhesion layer.

Moreover, the implanted region 24*b* of the heater 24 is converted to titanium silicon nitride, which has higher resistivity than the non-implanted titanium nitride region 27. Annealed silicon-implanted titanium nitride, or titanium silicon nitride has a very high adhesion to overlying layers including chalcogenide containing layers.

Thus, a dual resistance heater 24 is formed at the same time that the top portion 40*a* of the second dielectric layer 40 is modified to make it an effective glue layer. In this embodiment, the top portion 40*a* of the second dielectric layer 40 is substantially planar. In other words, it does not extend into the opening 42 that includes the heater 24.

Figure 20:
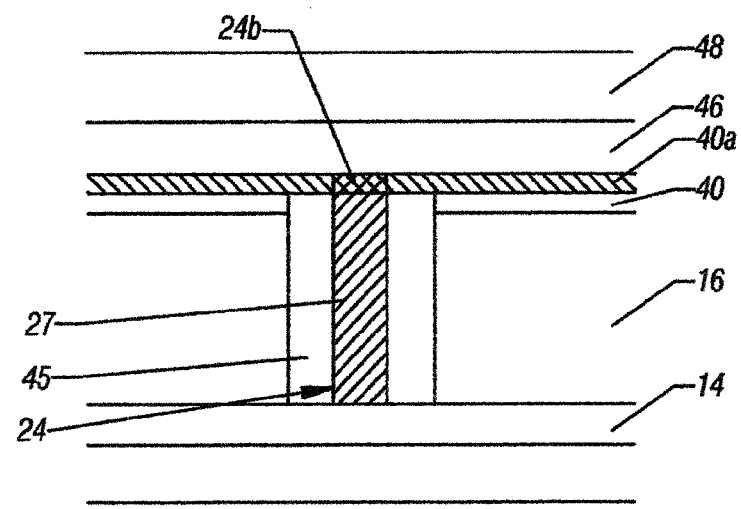
Figure 21:
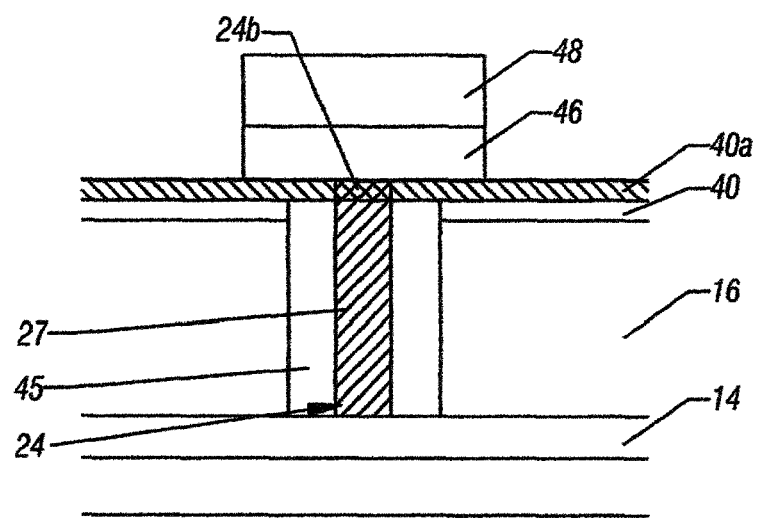

Next, as shown in FIG. 20, a chalcogenide layer 46 is deposited, followed by an upper electrode 48. Then, referring to FIG. 21, the upper electrode 48 and the chalcogenide layer 46 are patterned.

Finally, it is clear that numerous variations and modifications may be made to method and the contact region, the phase change memory cell and process described and illustrated herein, all falling within the scope of the invention as defined in the attached claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A method of fabricating a phase change device, the method comprising:
   forming a resistive material heater layer in a dielectric layer; the resistive material heater layer having two regions, a top surface region and a bulk region;
   increasing a resistance of the top surface region of the resistive material heater layer to be a higher resistance than the bulk region;
   forming a phase change material layer overlying the resistive material heater layer and the dielectric layer, the phase change material layer being in contact with the top surface region of the resistive material heater layer; and
   planarizing an uppermost portion of the phase change material to be substantially coplanar with an uppermost portion of the dielectric layer.

2. The method of claim 1, further comprising implanting ions into the top surface region to increase a resistance of the top surface region.

3. The method of claim 2, further comprising selecting the ion implantation species to be silicon.

4. The method of claim 2, further comprising annealing the phase change device subsequent to implanting ions to activate the implanted species.

5. The method of claim 1, further comprising increasing a resistance of the top surface region by exposing at least the top surface region to a plasma treatment.

6. The method of claim 1, further comprising reacting the at least the top surface region with oxygen.

7. The method of claim 1, wherein the top surface region comprises a few surface layers.

8. A method of fabricating a memory device, the method comprising:
   forming a conductive row line over a substrate;
   forming a dielectric layer over the conductive row line;
   forming an aperture in the dielectric layer;
   forming a resistive material heater layer in the dielectric layer; the resistive material heater layer having two regions, a top surface region and a bulk region;
   increasing a resistance value of the top surface region of the resistive material heater layer to be at a higher resistance value than the bulk region;
   forming a phase change material layer overlying the resistive material heater layer, the phase change material layer being in contact with the top surface region of the resistive material heater layer; and
   planarizing an uppermost portion of the phase change material to be substantially coplanar with an uppermost portion of the dielectric layer.

9. The method of claim 8, further comprising:
   forming at least one spacer within the aperture prior to forming the resistive material heater layer; and
   forming the resistive material heater layer at least within an area located within a region circumscribed by the at least one spacer.

10. The method of claim 9, wherein the at least one spacer comprises a dielectric material.

11. The method of claim 9, further comprising forming the phase change material layer at least partially within an area located within a region circumscribed by the at least one spacer.

12. The method of claim 8, wherein the phase change material comprises a material that includes at least one element from column VI of the periodic table.

13. The method of claim 8, wherein the phase change material is a chalcogenic material.

14. The method of claim 8, further comprising forming a silicon-implanted nitride to form an adhesion layer over the top surface region prior to forming the phase change layer.

15. The method of claim 8, further comprising forming a conductive column line over an uppermost surface of the phase change material layer.

16. The method of claim 15, further comprising forming a switching material layer between the uppermost surface of the phase change material layer and the conductive column line.

17. The method of claim 16, wherein the switching material layer comprises a chalcogenide material configured not to change phase.

18. A method of fabricating a phase change memory device, the method comprising:
forming a conductive row line over a substrate;
forming a resistive material heater layer in a dielectric layer formed on the substrate; the resistive material heater layer having a top surface region and a bulk region, the bulk region being formed proximate to the conductive row line with the top surface region being formed distal from the conductive row line, and a volume of the top surface region being much smaller than a volume of the bulk region;
increasing a resistance value of the top surface region of the resistive material heater layer to be at higher resistance value than the bulk region;
forming a phase change material layer overlying the resistive material heater layer and the dielectric layer, the phase change material layer being in contact with the top surface region of the resistive material heater layer;
planarizing an uppermost portion of the phase change material to be substantially coplanar with an uppermost portion of the dielectric layer; and
forming a switching device over an uppermost surface of the phase change material layer.

19. The method of claim 18, further comprising diffusing oxygen ions within the top surface region of the resistive material heater layer.

20. The method of claim 18, wherein the bulk region is in electrical contact with the conductive row line.

21. The method of claim 18, further comprising forming a conductive column line over the phase change material layer with the switching device located therebetween.

22. The method of claim 18, wherein, prior to increasing the resistance value of the top surface region, the top surface region and the bulk region comprise the same material.

* * * * *